United States Patent
Mui et al.

(10) Patent No.: US 10,679,871 B2
(45) Date of Patent: Jun. 9, 2020

(54) METHOD AND APPARATUS FOR PROCESSING WAFER-SHAPED ARTICLES

(71) Applicant: LAM RESEARCH AG, Villach (AT)

(72) Inventors: David Mui, Fremont, CA (US); Butch Berney, Pleasanton, CA (US); Alois Goller, Villach (AT); Mike Ravkin, Los Altos, CA (US)

(73) Assignee: Lam Research AG, Villach (AT)

( * ) Notice: Subject to any disclaimer, the term of this patent is extended or adjusted under 35 U.S.C. 154(b) by 399 days.

(21) Appl. No.: 15/169,330

(22) Filed: May 31, 2016

(65) Prior Publication Data
US 2017/0345681 A1    Nov. 30, 2017

(51) Int. Cl.
*H01L 21/67* (2006.01)
*H01L 21/687* (2006.01)

(52) U.S. Cl.
CPC .... *H01L 21/6708* (2013.01); *H01L 21/67051* (2013.01); *H01L 21/67115* (2013.01); *H01L 21/67248* (2013.01); *H01L 21/68757* (2013.01)

(58) Field of Classification Search
CPC .......... H01L 21/67051; H01L 21/6708; H01L 21/67115; H01L 21/67248; H01L 21/6715
See application file for complete search history.

(56) References Cited

U.S. PATENT DOCUMENTS

| | | |
|---|---|---|
| 4,903,717 A | 2/1990 | Sumnitsch |
| 5,513,668 A | 5/1996 | Sumnitsch |
| 6,359,264 B1 * | 3/2002 | Schaper ............ H01L 21/67126 118/724 |
| 6,485,531 B1 | 11/2002 | Schob |
| 9,093,482 B2 | 7/2015 | Brugger et al. |
| 9,245,777 B2 | 1/2016 | Plazonic et al. |
| 2006/0144330 A1 | 7/2006 | Takekuma et al. |

(Continued)

FOREIGN PATENT DOCUMENTS

| | | |
|---|---|---|
| EP | 0970511 B1 | 1/2005 |
| JP | 2004214449 A | 7/2004 |

(Continued)

OTHER PUBLICATIONS

KR20150066289—Machine Translation (Year: 2015).*
(Continued)

*Primary Examiner* — Marc Lorenzi
(74) *Attorney, Agent, or Firm* — Schwegman Lundberg & Woessner, P.A.

(57) ABSTRACT

An apparatus for processing wafer-shaped articles comprises a rotary chuck and a heating assembly that faces a wafer-shaped article when positioned on the rotary chuck. A liquid dispenser positioned so as to dispense liquid onto a surface of a wafer-shaped article that faces away from the rotary chuck when positioned on the rotary chuck. The heating assembly comprises an array of radiant heating elements distributed among at least five individually controllable groups. The liquid dispenser comprises one or more dispensing orifices configured to move a discharge point from a more central region of the rotary chuck to a more peripheral region of the rotary chuck. A controller controls power supplied to each of the at least five individually controllable groups of radiant heating elements based on a position of the discharge point of the liquid dispenser.

21 Claims, 4 Drawing Sheets

(56) References Cited

U.S. PATENT DOCUMENTS

| | | |
|---|---|---|
| 2010/0206338 A1 | 8/2010 | Kraus et al. |
| 2012/0160274 A1 | 6/2012 | Kasai et al. |
| 2012/0186744 A1* | 7/2012 | Higashijima ..... H01L 21/67051 156/345.21 |
| 2013/0061873 A1 | 3/2013 | Hohenwarter et al. |
| 2013/0267099 A1* | 10/2013 | Yu ..................... H01L 21/6708 438/748 |
| 2013/0319476 A1* | 12/2013 | Aiura ................ H01L 21/67051 134/33 |
| 2014/0054280 A1 | 2/2014 | Hohenwarter et al. |
| 2014/0339215 A1 | 11/2014 | Plazonic et al. |
| 2015/0001202 A1 | 1/2015 | Crabb et al. |
| 2015/0273534 A1 | 10/2015 | Ootagaki et al. |
| 2017/0345681 A1 | 11/2017 | Mui et al. |
| 2018/0156665 A1 | 6/2018 | Jung et al. |

FOREIGN PATENT DOCUMENTS

| | | |
|---|---|---|
| JP | 2005505919 A | 2/2005 |
| JP | 2011211092 A | 10/2011 |
| JP | 2017224807 A | 12/2017 |
| KR | 20120059413 A | 6/2012 |
| KR | 20130000340 A | 1/2013 |
| KR | 20140135127 A | 11/2014 |
| KR | 20150066289 A * | 6/2015 |
| KR | 20170135714 A | 12/2017 |
| SG | 10201704180 | 12/2017 |
| TW | 201806058 A | 2/2018 |
| WO | 2007/101764 A1 | 9/2007 |
| WO | WO-2008/041211 A3 | 8/2008 |
| WO | WO-2014163744 A3 | 2/2015 |
| WO | WO-2017034057 | 3/2017 |

OTHER PUBLICATIONS

KR20120059413—Machine Translation (Year: 2012).*
International Search Report and Written Opinon for Application No. PCT/IB2018/053450 dated Jul. 16, 2018.
U.S. Appl. No. 15/169,330, filed May 31, 2016, in the names of David Mui et al., and entitled "Method and Apparatus for Processing Wafer-Shaped Articles", 23 pgs.
U.S. Appl. No. 15/598,275, filed May 17, 2017, Ante Plazonic.
Chinese Application Serial No. 201710400417.0, Office Action dated Feb. 3, 2020, w/ English Translation, 15 pgs.
Japanese Application Serial No. 2017-102203, Amendment filed Oct. 11, 2017, 14 pgs.
Japanese Application Serial No. 2017-102203, Amendment filed Nov. 17, 2017, 9 pgs.
Korean Application Serial No. 10-2017-0065174, Office Action dated Jan. 10, 2020, w/ English Translation, 14 pgs.

* cited by examiner

METHOD AND APPARATUS FOR PROCESSING WAFER-SHAPED ARTICLES

BACKGROUND OF THE INVENTION

1. Field of the Invention

The invention relates generally to a method and apparatus for processing wafer-shaped articles, such as semiconductor wafers, in an open or in a closed process chamber.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531. Treatment fluids which are driven outwardly from the edge of a rotating wafer due to centrifugal action are delivered to a common drain for disposal.

As the device features formed on such wafers continue to decrease in their layout dimensions, with an attendant increase in the aspect ratio of those device features, and as the diameter of such wafers continues to increase, the phenomenon of pattern collapse during drying of the wafers becomes increasingly problematic. Existing techniques for preventing pattern collapse are of limited effectiveness.

SUMMARY OF THE INVENTION

In one aspect, the present invention relates to an apparatus for processing wafer-shaped articles, comprising a rotary chuck adapted to hold a wafer-shaped article of a predetermined diameter thereon. The apparatus comprises a heating assembly that faces a wafer-shaped article when positioned on the rotary chuck, and a liquid dispenser positioned so as to dispense liquid onto a surface of a wafer-shaped article that faces away from the heating assembly when positioned on the rotary chuck. The heating assembly comprises an array of radiant heating elements distributed among at least five individually controllable groups each occupying a respectively different zone extending from a more central region of the rotary chuck to a more peripheral region of the rotary chuck. The liquid dispenser comprises one or more dispensing orifices configured to move a discharge point from a more central region of the rotary chuck to a more peripheral region of the rotary chuck. A controller controls power supplied to each of the at least five individually controllable groups of radiant heating elements based on a position of the discharge point of the liquid dispenser.

In preferred embodiments of the apparatus according to the present invention, the at least five individually controllable groups of radiant heating elements comprises at least ten individually controllable groups of radiant heating elements.

In preferred embodiments of the apparatus according to the present invention, the at least five individually controllable groups of radiant heating elements comprises at least fifteen individually controllable groups of radiant heating elements.

In preferred embodiments of the apparatus according to the present invention, the at least five individually controllable groups of radiant heating elements comprises at least twenty individually controllable groups of radiant heating elements.

In preferred embodiments of the apparatus according to the present invention, the radiant heating elements are LED heating elements.

In preferred embodiments of the apparatus according to the present invention, the LED heating elements emit radiation having a maximum intensity in a wavelength range from 380 nm to 650 nm.

In preferred embodiments of the apparatus according to the present invention, the LED heating elements emit radiation in a wavelength range from 380 nm to 650 nm.

In preferred embodiments of the apparatus according to the present invention, the heating assembly is positioned relative to the rotary chuck so as to heat a wafer shaped article held on the rotary chuck from one side only and without contacting the wafer shaped article.

In preferred embodiments of the apparatus according to the present invention, the heating assembly overlies the rotary chuck and is positioned between the rotary chuck and a surface of a wafer-shaped article that faces the rotary chuck when mounted on the rotary chuck.

In preferred embodiments of the apparatus according to the present invention, the liquid dispenser comprises an arm that is movable relative to the rotary chuck from a more central region of the rotary chuck to a more peripheral region of the rotary chuck.

In preferred embodiments of the apparatus according to the present invention, a plate that is transparent to radiation emitted by the radiant heating elements is mounted for rotation with the rotary chuck and is positioned between the heating assembly and a wafer-shaped article when positioned on the rotary chuck.

In preferred embodiments of the apparatus according to the present invention, the plate is made of quartz or sapphire.

In preferred embodiments of the apparatus according to the present invention, each of the at least five individually controllable groups of radiant heating elements is capable of applying a power intensity of at least 2 W/cm$^2$ to a wafer-shaped article when positioned on the rotary chuck.

In preferred embodiments of the apparatus according to the present invention, each of the at least five individually controllable groups of radiant heating elements is capable of applying a power intensity of at least 4 W/cm$^2$ to a wafer-shaped article when positioned on the rotary chuck.

In preferred embodiments of the apparatus according to the present invention, the at least five individually controllable groups of radiant heating elements are arranged concentrically to an axis of rotation of the rotary chuck.

In preferred embodiments of the apparatus according to the present invention, the controller is configured to supply full power to one of the at least five individually controllable groups in response to the discharge point of the liquid dispenser being aligned axially with the one of the at least five individually controllable groups.

In preferred embodiments of the apparatus according to the present invention, the controller is configured to supply an inner intermediate power that is less than the full power to another of the at least five individually controllable groups that is adjacent and radially inward of the one of the at least five individually controllable groups, in response to the discharge point of the liquid dispenser being aligned axially with the one of the at least five individually controllable groups.

In preferred embodiments of the apparatus according to the present invention, the controller is configured to supply an outer intermediate power that is less than the full power to yet another of the at least five individually controllable groups that is adjacent and radially outward of the one of the at least five individually controllable groups, in response to the discharge point of the liquid dispenser being aligned axially with the one of the at least five individually controllable groups.

In preferred embodiments of the apparatus according to the present invention, the outer intermediate power is greater than the inner intermediate power.

In preferred embodiments of the apparatus according to the present invention, the heating assembly comprises an array of light-emitting diodes (LEDs) that is substantially coextensive with a wafer shaped article of the predetermined diameter.

In preferred embodiments of the apparatus according to the present invention, the rotary chuck comprises a rotatable chuck body surrounding a central stationary post, and the heating assembly is mounted to an upper end of the central stationary post.

In another aspect, the present invention relates to a method for processing wafers shaped articles, comprising the use of the apparatus having one or more of the aforesaid characteristics, in the manner described herein.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1A:
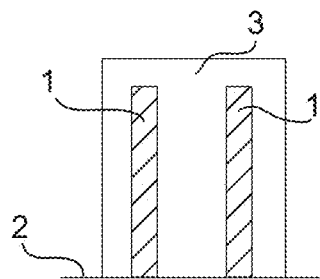
FIGS. 1a, 1b and 1c are an explanatory illustration of the phenomenon of pattern collapse.
Figure 1B:
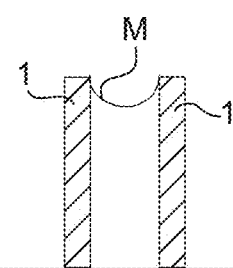
Figure 1C:
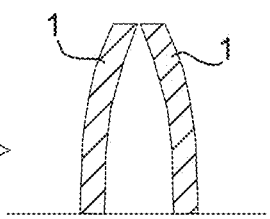

Referring now to FIG. 1, device features 1 formed on a semiconductor wafer 2 may be fins of doped silicon or any other structures or materials formed or used in the fabrication of semiconductor devices. During processing, the wafer 2 is rinsed, typically first with water and then with isopropyl alcohol IPA, which is shown at 3 in FIG. 1a surrounding the fins 1. As the wafer is dried, the IPA 3 evaporates; however, owing to surface tension and the high aspect ratio of the fins 1, the IPA 3 is driven off more slowly from the space between the fins, which results in the formation of a meniscus shown at M in FIG. 1b. As drying of the wafer continues, the surface tension of the IPA 3 pulls the fins 1 toward each other as shown in FIG. 1c, which can impair or prevent the correct performance of the associated semiconductor device.

Conventional techniques for mitigating the phenomenon of pattern collapse include the use of a rinse liquid having lower surface tension than deionized water, with IPA being the predominant choice, and the use of such rinse liquid at elevated temperature; however, as noted above, such techniques have limited effect on reducing pattern collapse.

The present inventors have discovered that rapid localized heating of the wafer along a moving front can serve to evaporate the rinse liquid sufficiently quickly that a meniscus as shown in FIG. 1b is not formed, and the attendant pattern collapse shown in FIG. 1c is thereby avoided.

Figure 2:
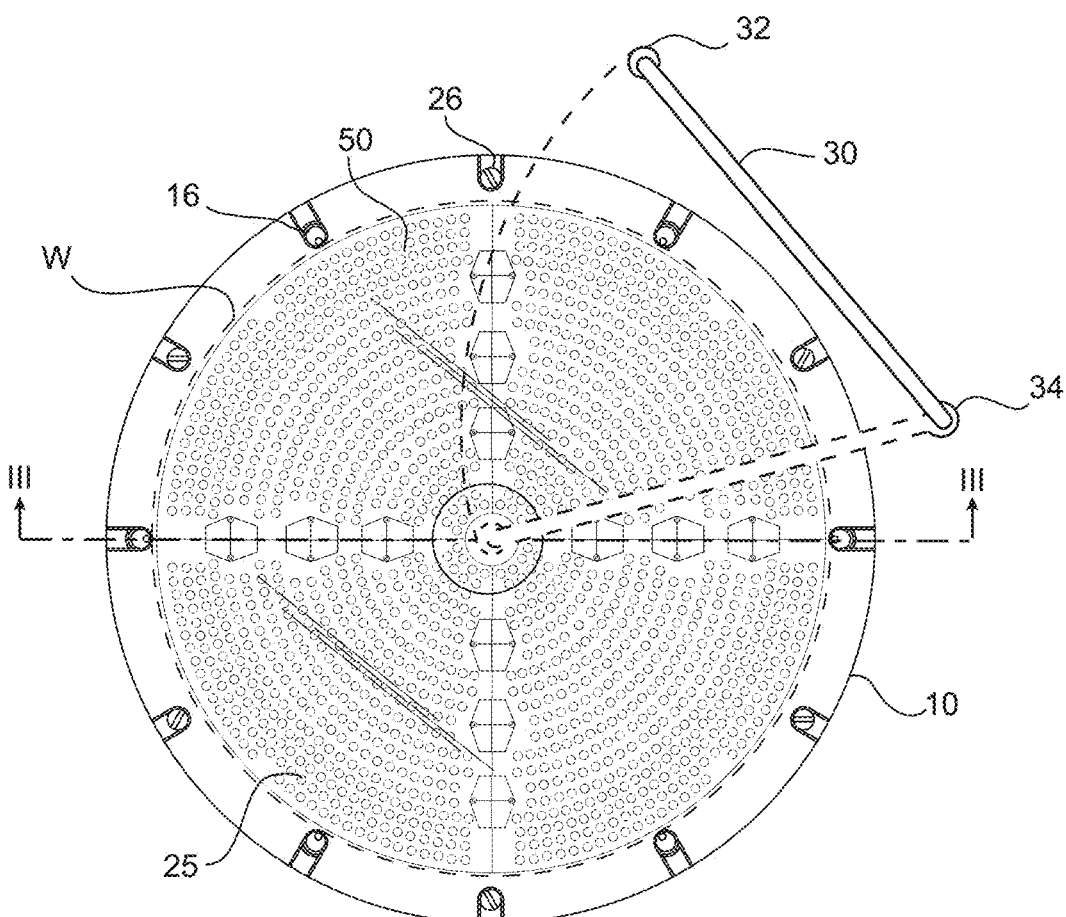
FIG. 2 is a plan view of an apparatus according to a first embodiment of the present invention.

FIG. 2 shows a first embodiment of an apparatus designed to implement that discovery, in which a rotary chuck 10 is designed to hold and rotate a wafer W of a predetermined diameter, for example 300 mm or 450 mm. Wafer W is held by a circular series of gripping pins 16, which in this embodiment are six in number. Pins 16 pass through openings in a transparent plate 25 made of quartz or sapphire. Plate 25 is secured to chuck 10 by screws 26 and rotates with the chuck 10. When a wafer W is positioned on the chuck, it is held above the plate 25 so that the lower surface of the wafer is parallel to the plate 25 and spaced therefrom by a small gap.

Beneath the transparent plate 25 is mounted a radiant heating assembly 50, which will be described in greater detail below.

Adjacent the chuck 10 a boom swing arm 30 is mounted for pivotal motion about its drive motor 34. Arm 30 is supplied with process and/or rinse liquid, which is discharged downwardly through its discharge nozzle 32. Boom swing arm 30 is movable between a standby position shown in solid line in FIG. 2, and a central position shown in broken line. Discharge nozzle 32 can therefore scan across the full radius of a wafer W, and when a wafer W is rotated by chuck 10, thereby dispense liquid onto its entire upwardly-facing surface.

Figure 3:
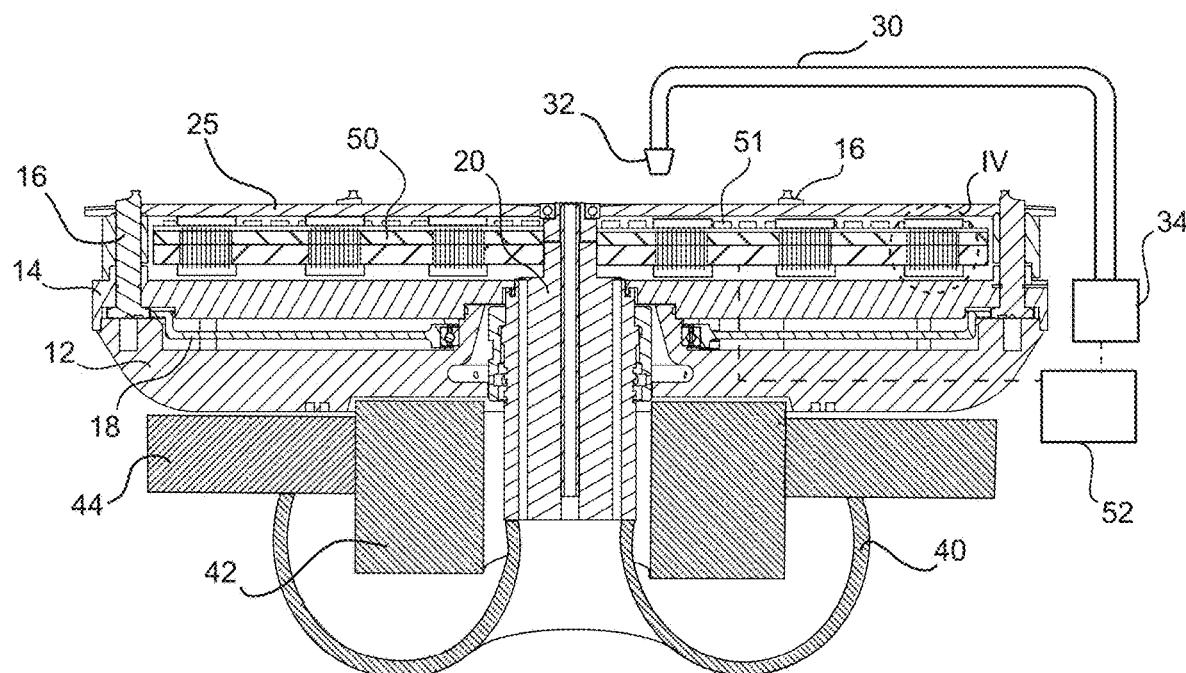
FIG. 3 is a sectional view along the line III-III in FIG. 2.

Turning now to FIG. 3, it can be seen that the rotary chuck 10 is made up of a lower chuck body 12 and an upper chuck body 14, which are secured to one another and are journalled for rotation about a stationary central post 20. The pins 16 and transparent plate 25 also rotate with the chuck 10 in this embodiment, as does the ring gear 18 which is in continuous meshing engagement with each of the gripping pins 16 via gear teeth provided at the bases of these latter. Ring gear 18 can also rotate relative to the chuck 10 to a limit extent, thereby to rotate pins 16 about their respective axes and move the uppermost eccentric gripping portions between their open and closed positions, in a manner well known per se.

The stationary post 20 is mounted on a machine frame 40 of the apparatus, as is a stator 44, whereas rotor 42 is secured to the lower chuck body 12, with the stator 44 and rotor 42 constituting a magnetic motor that drives the chuck 10 in rotation. Further particulars of the overall chuck structure are described for example in commonly-owned U.S. Pat. No. 9,245,777.

Radiant heating assembly 50 in this embodiment is mounted on the stationary post 20, and therefore does not rotate, whereas it is enveloped by the rotating structure of the chuck comprising elements 25, 14, 16. Radiant heating assembly 50 in this embodiment comprises a multiplicity of blue LEDs 51 mounted facing the transparent plate 25, and a controller 52 (e.g. an on-board controller (not shown) mounted on the underside of heating assembly 50). Controller 52 controls the turning on and off, as well as the power, of the blue LEDs 51, and also communicates wirelessly with the motor 34 of the boom swing arm 30.

Figure 4:
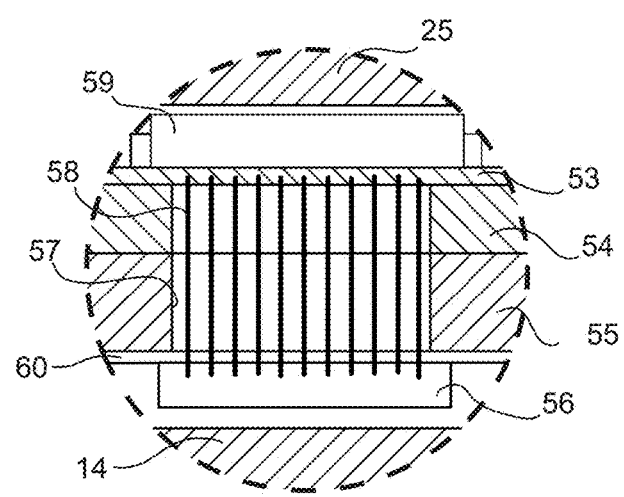
FIG. 4 is an enlarged view of the detail IV in FIG. 3.

As shown in FIG. 4, the radiant heating assembly 50 is composed of an aluminum substrate made up of upper and lower pieces 54 and 55 that are brazed together, the aluminum substrate serving as a heat sink to prevent excessive heating of the structure beneath the blue LED elements 51. A printed circuit board 53 is mounted on top of upper piece 54, on which the traces for the LED elements are formed and on which the LED elements 51 are mounted.

Onboard chips 56 are mounted on a printed circuit board 60 secured to the underside of lower piece 55. Wires 58 interconnecting the output pins of onboard chips 56 and the input terminals of the traces formed on PCB 53 are accommodated in pockets 57 that pass through the aluminum substrate 53, 54.

Figure 5:
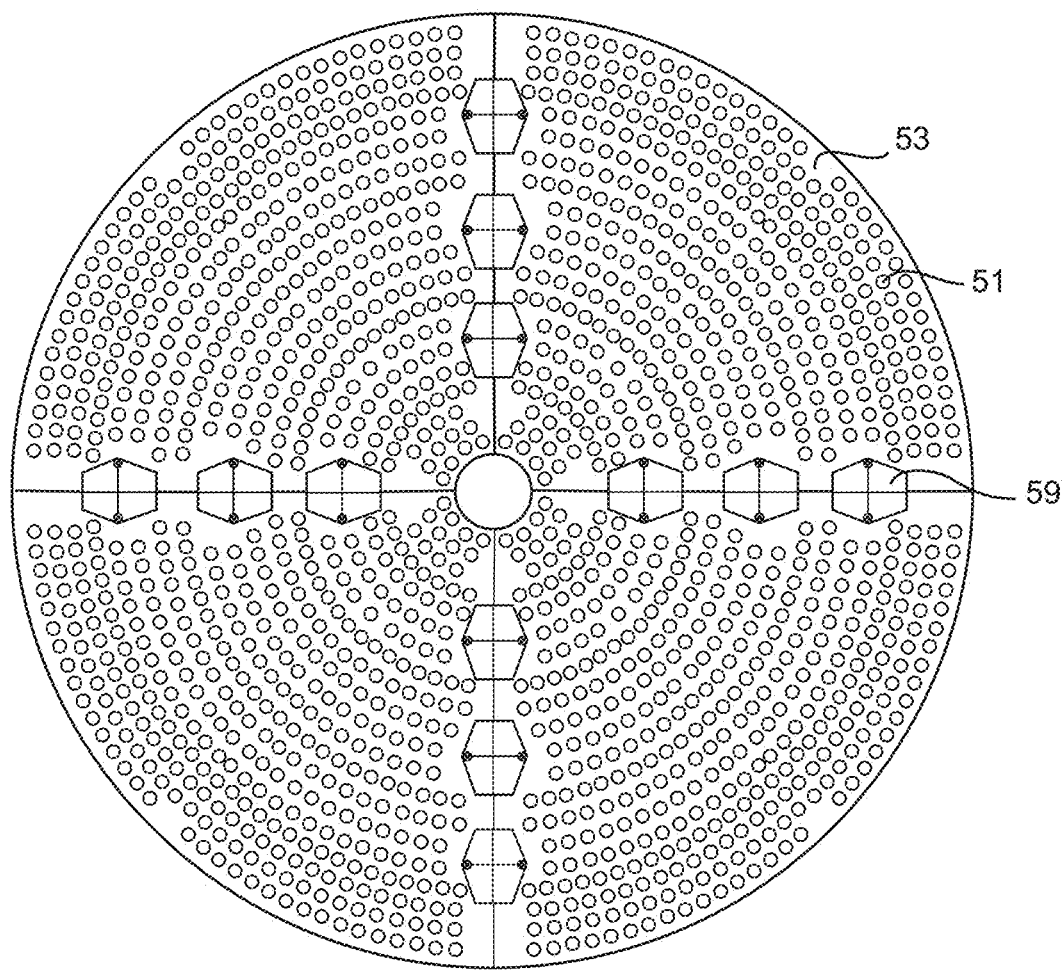
FIG. 5 is a plan view of the heating assembly of this embodiment.

As shown in FIG. 5, the PCB 53 of this embodiment is formed in four quadrants, which are joined together by connectors 59. The LED elements 51 are formed in groups of sixteen, i.e., the arrangement of onboard chips 56 and the connections from those chips to PCB 53, along with the onboard controller 52, permit the LEDs to be powered individually in groups as small as sixteen.

It will be seen in FIG. 5 that the LEDs 51 are arranged in twenty concentric circles, and that the number of LEDs in each circle is a multiple of sixteen. Thus, each concentric circle can be individually controlled as a separate heating zone, by virtue of the arrangement described above.

The blue LED lamps 51 have a maximum intensity at a wavelength of about 450 nm. Other sources of radiation could be used, but it is preferred to use sources emitting radiation having a maximum intensity in a wavelength range from 390 nm to 550 nm and more preferably in a wavelength range from 400 nm to 500 nm.

Whereas radiation of that wavelength characteristic is largely transmitted by the plate 25, that same radiation is largely absorbed by the semiconductor material of the wafer W, especially when the wafer W is silicon.

This arrangement allows very fast local heating of the wafer W, in a manner that causes evaporation of rinse liquid before the damaging meniscus has a chance to form. For example, each LED 51 may have a power consumption of 10 W and provides a light power of 3 W, which light power can be generated nearly instantaneously. Additionally, lesser light powers can be generated for selected LEDs 51 when desired, for examples by pulsing the power supply to selected LEDs 51 at for example 500 Hz, in a manner known per se.

Figure 6A:
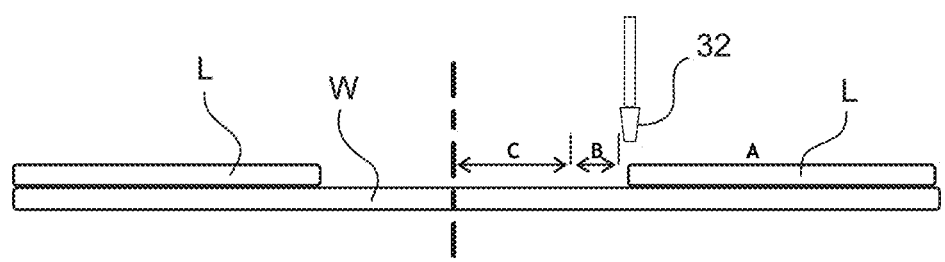
FIGS. 6a and 6b show preferred processing conditions for use of the embodiment of FIGS. 1-5.
Figure 6B:
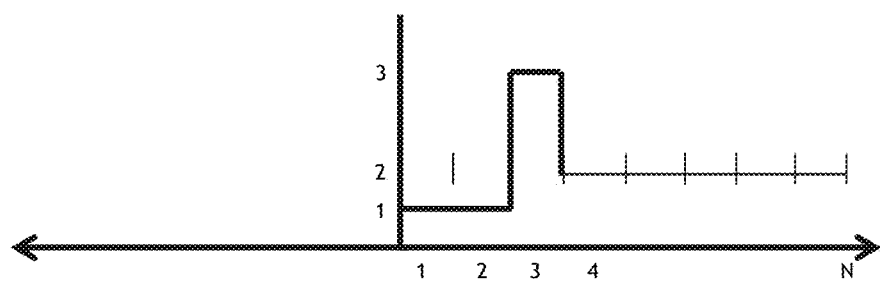

FIGS. 6a and 6b show a preferred example of operation of the apparatus of this embodiment. The wafer W can be considered to be divided into N zones 1, 2, 3, 4, . . . N, corresponding to the number of individually controllable concentric zones of the heating assembly 50, such that the abscissa in FIG. 6b represents the number of zones as well as the radial distance from the center to the edge of the wafer.

In the region A shown in FIG. 6a, liquid L remains on the surface of wafer W, and the objective is to heat that liquid L, which in this example is isopropyl alcohol (IPA) to a temperature that is elevated but which does not cause premature drying of the wafer W. That temperature corresponds to the heat flux of the heater in zones 4 through N being maintained at level 2, as shown on the ordinate in FIG. 6b.

On the other hand, in the region B, corresponding to zone 3 of the radiant heating assembly 50, the temperature of the wafer W is elevated substantially so as to cause the evaporation rate of the IPA to be sufficiently high that there is no meniscus (i.e., a flat or 90° meniscus) between closely adjacent device features, so as to avoid pattern collapse as described above. Within region C, corresponding to heater zones 1 and 2, the already dried wafer is maintained at a lower but still elevated temperature, to ensure complete evaporation of rinse liquid and to prevent condensation on the dried wafer surface.

It will be appreciated that the control of the power supplied to the various concentric zones of the heating assembly corresponds to the radial position of the discharge nozzle 32 of the rinse fluid, and thus controller 52 controls the power supply to the LEDs 51 of the relevant zones based on the radial position of the discharge nozzle.

Figure 7:
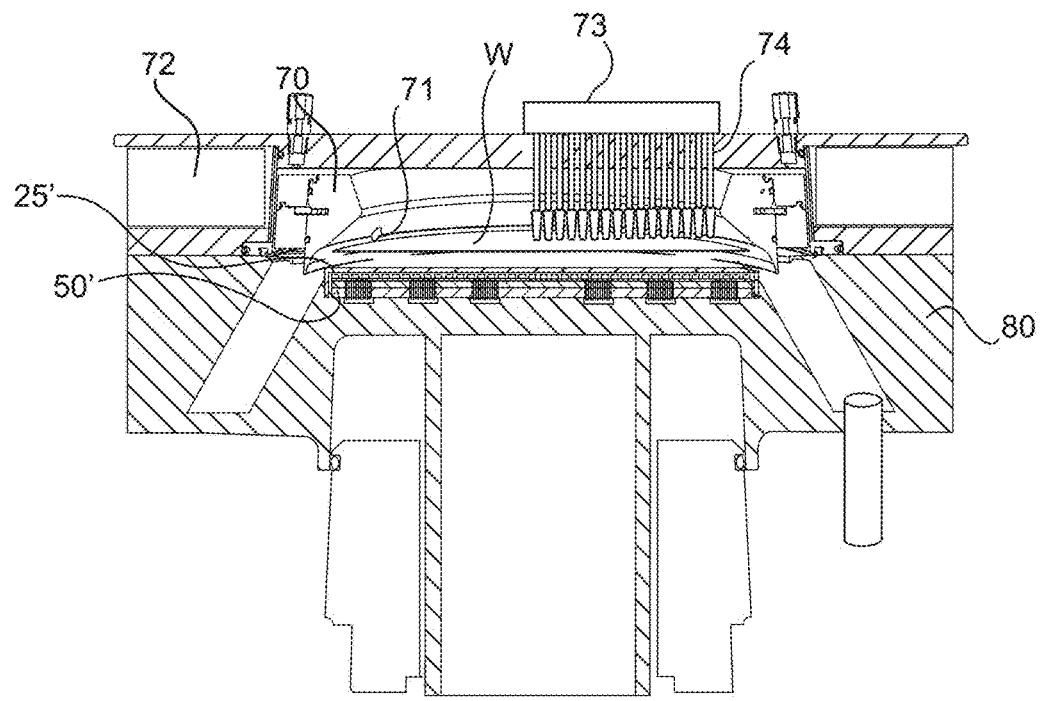
FIG. 7 shows an apparatus according to a second embodiment of the present invention in a use position.
Figure 8:
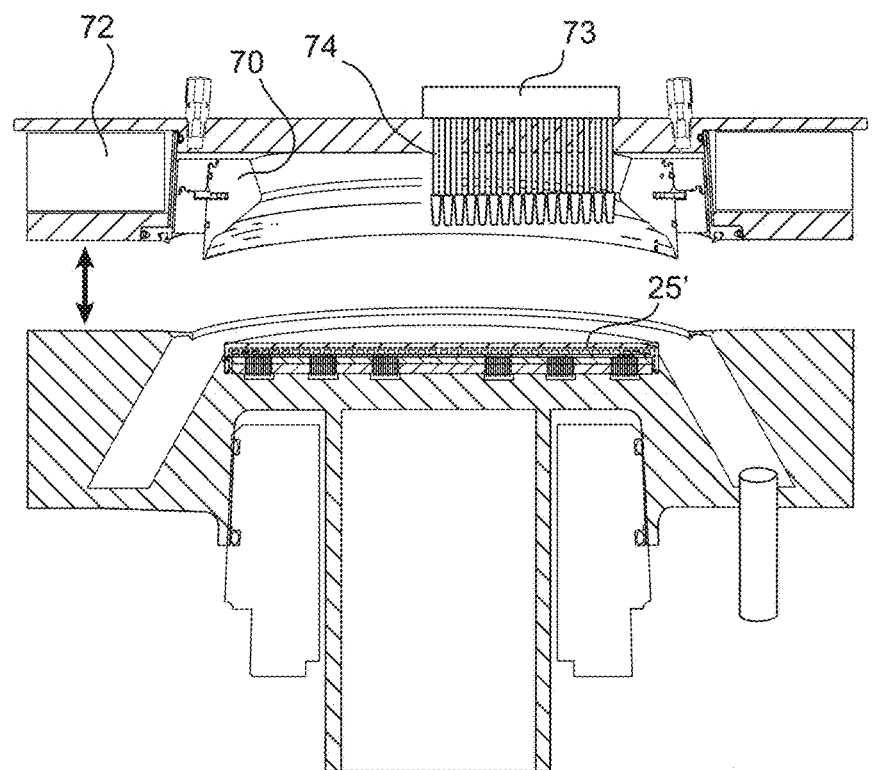
FIG. 8 shows the embodiment of FIG. 7 in a loading and unloading position.

FIGS. 7 and 8 show an alternative embodiment in which the chuck is a magnetic ring rotor 70 positioned within a closed chamber 80, and driven in rotation by a stator 72 positioned outside of the chamber 80. A wafer W is held by gripping elements 71 that project downwardly from the ring rotor 70.

The chamber 80 can be opened for loading and removal of a wafer W as shown in FIG. 8. The heating assembly 50' is incorporated into the lower part of housing 80, and is generally similar to that described in connection with the preceding embodiment, except that in this embodiment the transparent plate 25' is stationary and does not rotate with the magnetic rotor 70.

Furthermore, in this embodiment, instead of a radially movable liquid dispenser 30, there is provided a series of fixed liquid dispensing nozzles 74 fed by a manifold 73. Rinse liquid can be supplied serially to these nozzles 74, starting with the most central and continuing to the most peripheral, so as to approximate the dispensing action of the boom swing arm 30 of the preceding embodiments. In this case, therefore, the controller 52 would control the power supply to the selected groups of LEDs 51 based on which nozzle 74 was dispensing liquid.

While the present invention has been described in connection with various preferred embodiments thereof, it is to be understood that those embodiments are provided merely to illustrate the invention, and that the invention is not limited to those embodiments, but rather includes that which is encompassed by the true scope and spirit of the appended claims.

What is claimed is:

1. An apparatus for processing wafer-shaped articles, comprising:
   a rotary chuck adapted to hold a wafer-shaped article of a predetermined diameter thereon,
   a heating assembly that faces a wafer-shaped article when positioned on said rotary chuck, and
   a liquid dispenser positioned so as to dispense liquid onto a surface of a wafer-shaped article that faces away from said heating assembly when positioned on said rotary chuck,
   said heating assembly comprising an array of radiant heating elements distributed among at least five individually controllable groups each occupying a respectively different zone extending from a more central region of said rotary chuck to a more peripheral region of said rotary chuck,
   said liquid dispenser comprising a discharge nozzle and configured to move said discharge nozzle from said more central region of said rotary chuck to said more peripheral region of said rotary chuck while said discharge nozzle discharges liquid, and a controller configured to control power supplied to each of said at least five individually controllable groups of radiant heating elements based on a radial position of said discharge nozzle while said liquid dispenser moves said discharge nozzle from said more central region of said rotary chuck to said more peripheral region of said rotary chuck while said discharge nozzle discharges liquid.

2. The apparatus according to claim 1, wherein said at least five individually controllable groups of radiant heating elements comprises at least ten individually controllable groups of radiant heating elements.

3. The apparatus according to claim 1, wherein said at least five individually controllable groups of radiant heating elements comprises at least fifteen individually controllable groups of radiant heating elements.

4. The apparatus according to claim 1, wherein said at least at least five individually controllable groups of radiant heating elements comprises at least twenty individually controllable groups of radiant heating elements.

5. The apparatus according to claim 1, wherein said radiant heating elements are LED heating elements.

6. The apparatus according to claim 5, wherein the LED heating elements emit radiation having a maximum intensity in a wavelength range from 380 nm to 650 nm.

7. The apparatus according to claim 5, wherein the LED heating elements emit radiation in a wavelength range from 380 nm to 650 nm.

8. The apparatus according to claim 1, wherein said heating assembly is positioned relative to said rotary chuck so as to heat a wafer-shaped article held on said rotary chuck from one side only and without contacting the wafer-shaped article.

9. The apparatus according to claim 1, wherein said heating assembly overlies said rotary chuck and is positioned between said rotary chuck and a surface of the wafer-shaped article that faces the rotary chuck when mounted on the rotary chuck.

10. The apparatus according to claim 9, wherein said liquid dispenser comprises an arm that is movable relative to said rotary chuck from said more central region of said rotary chuck to said more peripheral region of said rotary chuck.

11. The apparatus according to claim 1, further comprising a plate that is transparent to radiation emitted by said radiant heating elements, said plate being mounted for rotation with said rotary chuck and being positioned between said heating assembly and the wafer-shaped article when positioned on said rotary chuck.

12. The apparatus according to claim 11, wherein said plate is made of quartz or sapphire.

13. The apparatus according to claim 1, wherein each of said at least five individually controllable groups of radiant heating elements is capable of applying a power intensity of at least 2 W/cm$^2$ to a wafer-shaped article when positioned on said rotary chuck.

14. The apparatus according to claim 1, wherein each of said at least at least five individually controllable groups of radiant heating elements is capable of applying a power intensity of at least 4 W/cm$^2$ to a wafer-shaped article when positioned on said rotary chuck.

15. The apparatus according to claim 1, wherein said at least five individually controllable groups of radiant heating elements are arranged concentrically with respect to an axis of rotation of said rotary chuck.

16. The apparatus according to claim 1, wherein said controller is configured to supply full power to one of said at least five individually controllable groups in response to said radial position of said discharge nozzle being aligned axially with said one of said at least five individually controllable groups.

17. The apparatus according to claim 16, wherein said controller is configured to supply an inner intermediate power that is less than said full power to another of said at least five individually controllable groups that is adjacent and radially inward of said one of said at least five individually controllable groups, in response to said radial position of said discharge nozzle being aligned axially with said one of said at least five individually controllable groups.

18. The apparatus according to claim 16, wherein said controller is configured to supply an outer intermediate power that is less than said full power to another of said at least five individually controllable groups that is adjacent and radially outward of said one of said at least five individually controllable groups, in response to said radial position of said discharge nozzle being aligned axially with said one of said at least five individually controllable groups.

19. The apparatus according to claim 18, wherein said controller is configured to supply an inner intermediate power that is less than said full power to yet another of said at least five individually controllable groups that is adjacent and radially inward of said one of said at least five individually controllable groups, in response to said radial position of said discharge nozzle being aligned axially with said one of said at least five individually controllable groups, and wherein said outer intermediate power is greater than said inner intermediate power.

20. The apparatus according to claim 1, wherein said heating assembly comprises an array of light-emitting diodes that is coextensive with the wafer-shaped article of said predetermined diameter.

21. The apparatus according to claim 1, wherein said rotary chuck comprises a rotatable chuck body surrounding a central stationary post, and wherein said heating assembly is mounted to an upper end of said central stationary post.

* * * * *